United States Patent
Hibdon et al.

[11] Patent Number: 5,436,576
[45] Date of Patent: Jul. 25, 1995

[54] SWITCH MATRICES USING REDUCED NUMBER OF SWITCHING DEVICES FOR SIGNAL ROUTING

[75] Inventors: Gregory B. Hibdon, Folsom; John M. Ingram, Sacramento, both of Calif.

[73] Assignee: Intel Corporation, Santa Clara, Calif.

[21] Appl. No.: 246,731

[22] Filed: May 20, 1994

[51] Int. Cl.$^6$ .................. G06F 7/38; H03K 19/173
[52] U.S. Cl. ........................ 326/47; 326/15; 340/825.83; 364/490
[58] Field of Search .......... 326/39, 41, 38, 47, 326/15; 340/825.83, 825.85, 825.87; 364/489, 490

[56] References Cited

U.S. PATENT DOCUMENTS

| | | | |
|---|---|---|---|
| 4,989,022 | 1/1991 | Hwang et al. | 340/825.8 |
| 5,153,463 | 10/1992 | Keiichi | 307/465 |
| 5,204,556 | 4/1993 | Shankar | 307/465.1 |
| 5,270,974 | 12/1993 | Reddy | 365/200 |
| 5,327,023 | 7/1994 | Kawana et al. | 307/465 |
| 5,371,495 | 12/1994 | Stulles et al. | 340/825.79 |

*Primary Examiner*—Edward P. Westin
*Assistant Examiner*—Stephen Calogero
*Attorney, Agent, or Firm*—Blakely, Sokoloff, Taylor & Zafman

[57] ABSTRACT

A switch matrix including a number of rows of input conductors, a number of columns of output conductors, and switching devices joining selected ones of the input conductors to selected ones of the output conductors, the switching devices being programmable to make connections between input and output conductors, the switching devices joining conductors being positioned on a random basis.

1 Claim, 5 Drawing Sheets

Figure 5

|  | C1 | C2 | C3 | C4 | C5 | C6 | C7 | C8 | C9 |
|---|---|---|---|---|---|---|---|---|---|
| R1 | 1 | 0 | 0 | 0 | 1 | 0 | 1 | 0 | 0 |
| R2 | 1 | 1 | 0 | 1 | 0 | 0 | 0 | 0 | 0 |
| R3 | 0 | 1 | 0 | 0 | 0 | 1 | 1 | 0 | 0 |
| R4 | 0 | 1 | 0 | 1 | 0 | 0 | 0 | 0 | 1 |
| R5 | 0 | 0 | 1 | 0 | 1 | 0 | 0 | 1 | 0 |
| R6 | 0 | 0 | 1 | 0 | 1 | 0 | 0 | 0 | 1 |
| R7 | 0 | 0 | 1 | 0 | 0 | 1 | 0 | 1 | 0 |
| R8 | 0 | 0 | 0 | 0 | 0 | 1 | 1 | 0 | 1 |
| R9 | 1 | 0 | 0 | 1 | 0 | 1 | 0 | 0 | 0 |

- R1–R3: First fractional (1/3) group of rows
- R4–R6: Second fractional (1/3) group of rows
- R7–R9: Third fractional (1/3) group of rows

Figure 4

|  | C1 | C2 | C3 | C4 | C5 | C6 | C7 | C8 |
|---|---|---|---|---|---|---|---|---|
| R1 | 0 | 1 | 0 | 1 | 1 | 0 | 0 | 1 |
| R2 | 1 | 1 | 0 | 0 | 0 | 1 | 0 | 1 |
| R3 | 0 | 1 | 0 | 0 | 1 | 1 | 1 | 0 |
| R4 | 1 | 0 | 0 | 0 | 1 | 0 | 1 | 1 |
| R5 | 1 | 0 | 1 | 0 | 1 | 1 | 0 | 0 |
| R6 | 0 | 0 | 1 | 1 | 1 | 0 | 1 | 0 |
| R7 | 1 | 0 | 1 | 1 | 0 | 0 | 0 | 1 |
| R8 | 0 | 1 | 1 | 1 | 0 | 1 | 0 | 0 |

- R1–R4: First fractional (1/2) group of rows
- R5–R8: Second fractional (1/2) group of rows

|    | C1 | C2 | C3 | C4 | C5 | C6 | C7 | C8 | C9 | C10 |
|----|----|----|----|----|----|----|----|----|----|-----|
| R1 | 0 | 1 | 0 | 1 | 0 | 0 | 0 | 1 | 0 | 1 |
| R2 | 1 | 0 | 0 | 0 | 0 | 0 | 1 | 0 | 1 | 1 |
| R3 | 1 | 0 | 0 | 0 | 1 | 0 | 1 | 0 | 1 | 0 |
| R4 | 0 | 1 | 1 | 0 | 0 | 1 | 0 | 1 | 0 | 0 |
| R5 | 1 | 0 | 0 | 0 | 0 | 0 | 1 | 0 | 1 | 1 |
| R6 | 0 | 1 | 0 | 1 | 0 | 0 | 0 | 1 | 0 | 1 |
| R7 | 0 | 1 | 1 | 0 | 0 | 1 | 0 | 1 | 0 | 0 |
| R8 | 0 | 0 | 1 | 1 | 1 | 1 | 0 | 0 | 0 | 0 |
| R9 | 0 | 0 | 1 | 1 | 1 | 1 | 0 | 0 | 0 | 0 |
| R10| 1 | 0 | 0 | 0 | 1 | 0 | 1 | 0 | 1 | 0 |

R1, R2: First fractional (2/5) group of rows
R3, R4: Second fractional (2/5) group of rows
R5, R6: Third fractional (2/5) group of rows
R7, R8: Fourth fractional (2/5) group of rows
R9, R10: Fifth fractional (2/5) group of rows

Figure 6

SWITCH MATRICES USING REDUCED NUMBER OF SWITCHING DEVICES FOR SIGNAL ROUTING

BACKGROUND OF THE INVENTION

1. Field of the Invention

This invention relates to digital systems, and more particularly, to methods and apparatus for providing switch matrices formed using a lesser number of switching devices than in prior art switch matrices while maintaining almost all routing paths previously available in full connection matrices.

2. History of the Prior Art

Switch matrices allow combinations of signals appearing on a large number of input signal conductors to be provided at a more limited number of output conductors. Essentially, a switch matrix comprises a first set of input conductors each of which may carry a binary input value and a second set of output conductors. The input conductors may be selectively joined to the set of output conductors by switching devices. In this manner, selective combinations of a typically large number of input signals may be furnished to a smaller number of output conductors. In a full connection matrix, any one of the input conductors may be selectively joined to each of the output conductors.

Switch matrices are used for many purposes in computer and other digital systems. For example, switch matrices are an essential part of field programmable logic arrays (PLAs). Field programmable logic arrays may be used in digital systems to provide particular logic operations using binary input signals. A PLA includes a switch matrix the output conductors of which are connected to gates which allow a plurality of input values to be manipulated in accordance with various Boolean functions. By connecting the input conductors to various AND gates and the outputs of the AND gates (product terms) to various OR gates, a particular Boolean function which is the sum of the product terms produced by the AND gates may be furnished at the output of any OR gate. The Boolean output function provided at the output of each of the OR gates is programmable by a user by programing the connections to be made by the switching devices between the input conductors and the output conductors of the switch matrix using devices such as electrically programmable read only memory (EPROM) cells, fuses, or flash EEPROM cells. Normally, a switching matrix is manufactured with the switching devices in place; and a user programs the switching devices necessary to provide the proper connections for the functions the user desires. In a full connection matrix, the number of steps required to program the switching devices equals the number of output conductors so that programming is a trivial process.

Most switch matrices include physical switching devices which allow all of the input conductors to connect to all of the output conductors. The provision of switching devices at each intersection between input and output conductors causes a number of problems.

One of the problems faced by designers of switch matrices is the large amount of die area required for the actual switching devices which may make the contacts to provide the various output combinations which may be programed. In a full connection matrix where each input conductor may be connected to each output conductor, the switching devices may occupy one-quarter of the entire die area. However, with field programmable switch matrices, it has become apparent that the number of switching devices might be reduced if the appropriate connections could still be completed. Reducing the number of actual switching devices allows the die area to be reduced thereby saving expense. It also increases the speed of operation since the length of the various conductors within the matrix may be shortened.

At least two major problems arise in attempting to reduce the number of switching devices used in a switch matrix. The first problem is to determine which switching devices may be omitted by the manufacturer while still allowing a user to obtain almost all permissible combinations of signals on the input conductors at the output conductors. A combination of input signals is permissible if the number of input signals in the combination is less than or equal to the total number of output signals. The second problem is to determine the particular connections which must be made by a user during programming in order to allow those switching devices which do exist to produce a particular desired output response for a given set of input signals. This programming is no longer the trivial process it is for a full connection matrix.

Each of these problems is complicated by the fact that the more advanced switching matrices tend to be quite large. For example, one recently designed matrix provides connections from 192 input conductors to 24 output conductors. With this number of conductors and many omitted switching devices, it is extremely difficult to test a significant number of combinations of input conductors to determine which are available at the output conductors. With prior art methods of testing, to test even one combination could require on the order of 24! (the factorial of 24) programming steps. It has been estimated that it would take hundreds of years to complete tests for such a switch matrix using conventional computers and prior art methods of testing.

It is, therefore, desirable to provide new methods for rapidly and accurately deciding which switching devices should be omitted in reduced size switch matrices and to provide methods for ascertaining which switching devices a user should connect in such matrices in order to make particular input combinations produce desired output combinations.

SUMMARY OF THE INVENTION

It is, therefore, an object of the present invention to provide apparatus and methods for devising switch matrices utilizing a reduced number of switching devices but capable of providing almost all of the connections between all permissible combinations of the inputs conductors and all of the output conductors.

It is another object of the present invention to provide methods for selecting those switching devices in a switch matrix which should be programmed in order to obtain particular output combinations from particular input combinations.

These and other objects of the present invention are realized in a switch matrix comprising a number of input conductors and a number of output conductors intersecting in logical row and column fashion, and switching devices joining selected ones of the input conductors to selected ones of the output conductors at the logical intersections, the switching devices being programmable to make connections between input and output conductors, the switching devices being placed on a random basis in each row, the fraction of switching devices in each row and each column being equal to the fraction of total switching devices to the total of intersections in the matrix.

These and other objects and features of the invention will be better understood by reference to the detailed description which follows taken together with the drawings in which like elements are referred to by like designations throughout the several views.

BRIEF DESCRIPTION OF THE DRAWINGS

FIG. 4 is a diagram illustrating the connections which may be made in a half-size switch matrix designed in accordance with the present invention.

FIG. 5 is a diagram illustrating connections which may be made in a one-third size switch matrix designed in accordance with the present invention.

FIG. 6 is a diagram illustrating connections which may be made in a two-fifths size switch matrix designed in accordance with the present invention.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
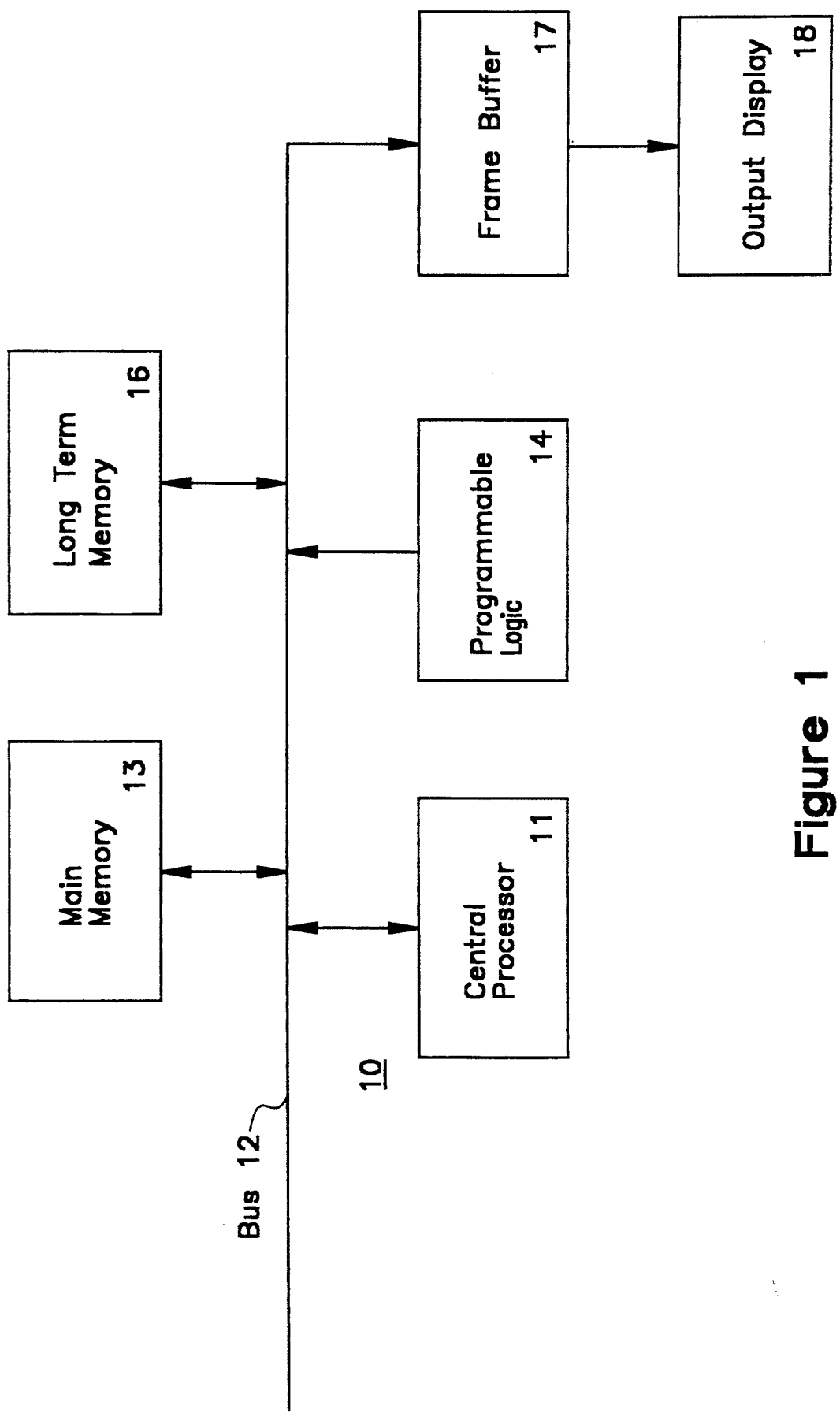
FIG. 1 is a block diagram of a computer system which may utilize the present invention.

Referring now to FIG. 1, there is illustrated a computer system 10. The system 10 includes a central processing unit 11 which executes the various instructions provided to control the operations of the computer system 10. The central processing unit 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also connected to the bus 12 are various peripheral components such as long term memory 16 and circuitry such as a frame buffer 17 to which data may be written which is to be transferred to an output device such as a monitor 18 for display.

A programmable logic circuit 14 (such as a programmable logic array, a programmable array logic circuit, or a programmable logic device) constructed in a manner well known to those skilled in the art is used to provide the logic circuitry by which various ones of the component circuits may be associated through the bus 12 with the system 10. Such circuitry is often referred to as glue logic. A programmable logic circuit may include switch matrix circuitry such as that described in this specification. Switch matrix circuitry may also be utilized in various other parts of the computer system 10 to provide a number of different functions such as instruction decoding functions associated with operations of processors utilized in various portions of the system.

Figure 2:
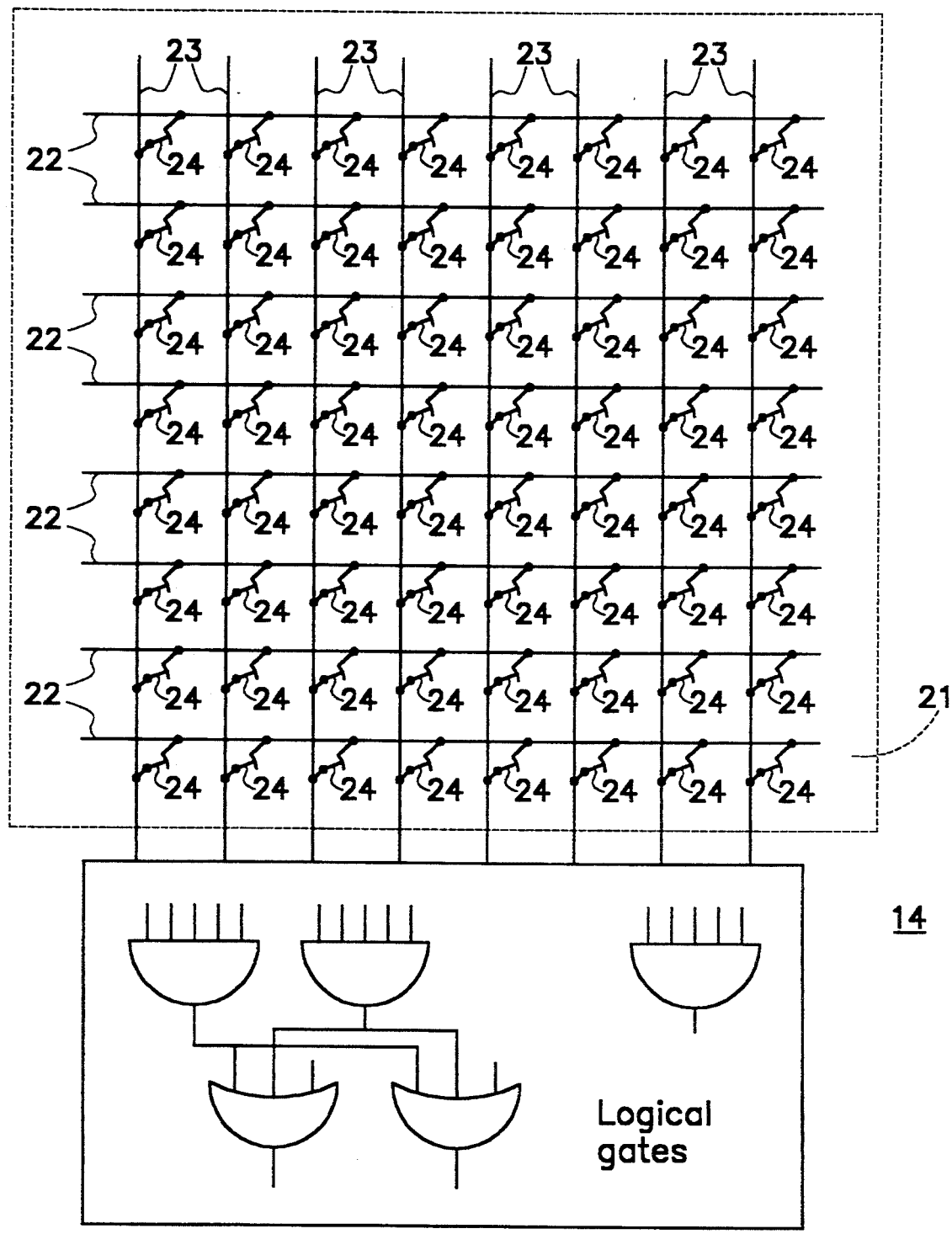
FIG. 2 is a block diagram of a conventional switch matrix of the prior art utilized in a programmable logic array.
Figure 3:
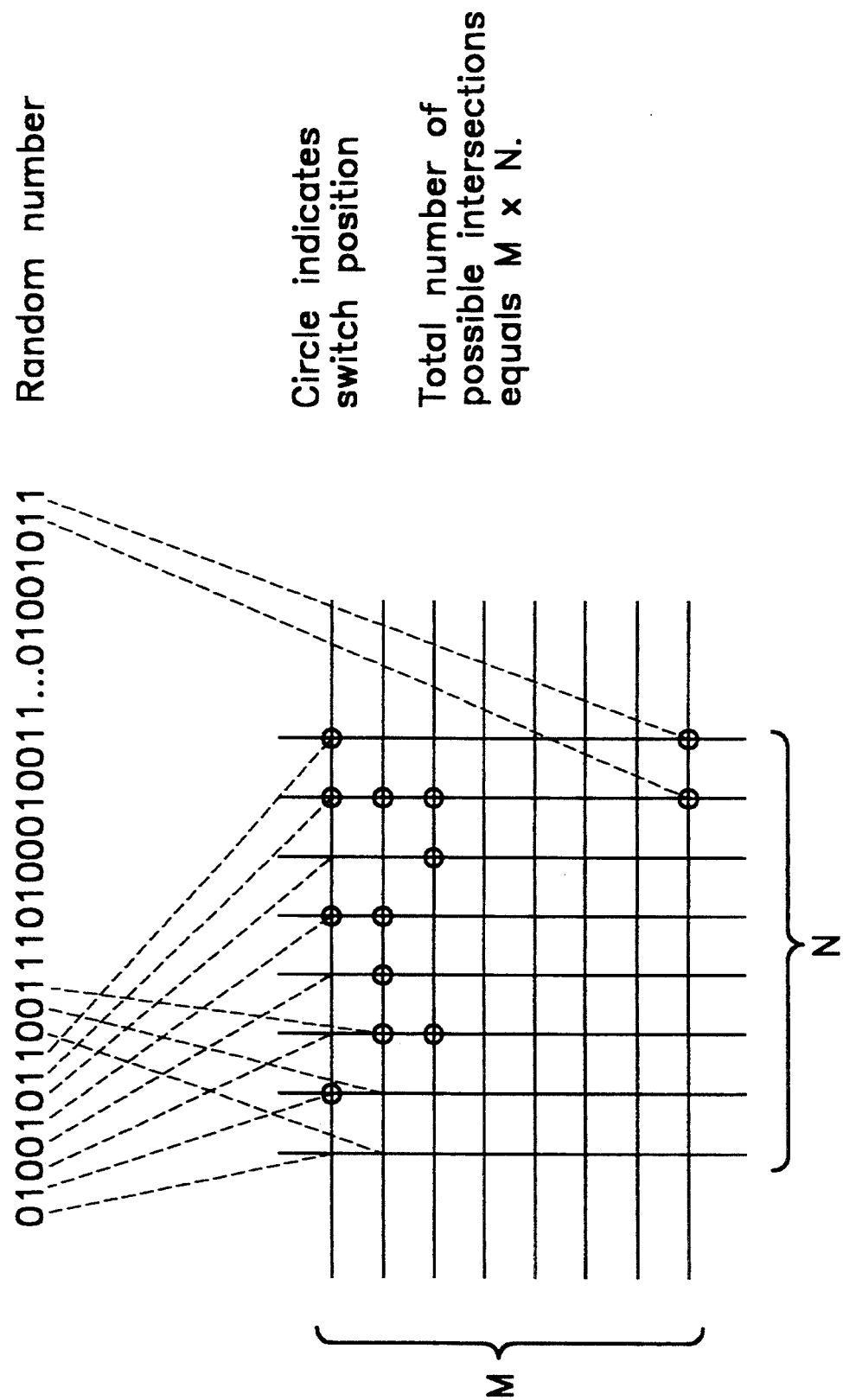
FIG. 3 is a diagram illustrating a first switch matrix constructed in accordance with the invention.

FIG. 2 illustrates combinatorial logic in a typical field programmable logic circuit 14 which may be utilized for carrying out various operations in a computer system such as that illustrated in FIG. 1 or in other digital systems. The circuit 14 may include one or more switch matrices 21 which provide a number of output signals in response to some number of input signals. The switch matrix 21 illustrated in FIG. 2 includes input conductors 22 which may be joined to output conductors 23 by a series of switching devices 24. The input conductors 22 are typically, though not necessarily, physically arranged in rows generally at right angles to columns of output conductors 23 allowing each input conductor 22 to be adjacent to each output conductor 23 so that the switching devices 24 may be easily arranged near the intersections to make the necessary connections. Since the physical row and column arrangement is not necessary so long as the input and output conductors are connected to provide this logical arrangement, this is referred to in this specification as a "logical row and column arrangement."

The switching devices 24 may be EPROM or similar memory devices which retain a condition when power is removed from the circuitry. In FIG. 2, a full connection matrix is illustrated in which a physical switch is available to connect each input conductor to each output conductor. Typically, a field programmable device sold to a user will include a full connection matrix. Such a matrix includes all of the switching devices necessary to make all of the very large number of combinations possible between the input and output conductors. The user will then program the field programmable device to carry out the particular operations the user desires by programming selected switching devices of the array to make connections which provide the desired logic functions. As pointed out, with a full connection matrix, the number of programming steps is equal to the number of output conductors from the switch matrix and is a trivial process.

It has been discovered that for switch matrices greater than a certain minimum size, a random distribution of switching devices available generally provides an almost complete set of combinations of input conductors at the output conductors where a reduction in the number of switching devices is attempted. The minimum size is essentially a size too small to provide a random pattern of switching devices. More particularly, if the number of switching devices is reduced to any fraction of the full connection (physical switching devices at each intersection of input and output conductors) size of the switch matrix, and if the number of switching devices physically available to connect all of the input conductors to all of the output conductors are placed at random throughout all of the possible intersecting positions, then almost all combinations of input signals will be available at the output conductors for that reduced size switch matrix. This may be easily accomplished by generating a random binary number having a length equal to the total number of possible intersections and a total of one values equal to the fraction desired multiplied by the total number of possible intersections. If the binary number is then parsed into portions equal in size to the number of output conductors, each portion of the binary number is assigned to the intersections available between one input conductor and all output conductors, and switching devices are placed at intersections indicated by one values, then a random distribution of switches will be attained. Such a random distribution will make almost all permissible combinations of input signals available at the output conductors for that reduced size switch matrix. It will be apparent that the coverage offered by such a fractional matrix will improve as the size of the matrix increases above the minimum size described above.

The coverage offered may be improved to some extent, especially in smaller matrices, by placing some constraints upon the distribution of switching devices. As a first order constraint, if the number of switching devices connecting each of the input conductors to all of the output conductors is essentially the same for each input conductor or for each output conductor, then the coverage will be improved. This may be attained by providing a random number for each input conductor with the number of one values indicating switches equal to the fraction to which the total number of switches is reduced multiplied by the number of output conductors.

The coverage may be further improved, especially in the smaller matrices, if the number of switching devices physically available to connect any input conductor to the output conductors and any output conductor to each input conductor is equal to that same fraction of the total number of intersecting conductors and if either the switching devices available to either the input conductors or the switching devices available to the output conductors (but not both) are distributed randomly, then almost all permissible combinations of input signals will be available at the output conductors for that reduced size switch matrix.

As an example, if the number of switching devices is to be reduced to half of a full connection switch matrix, if each input conductor connects to one-half of the possible output conductors in a random pattern and each output conductor connects to one-half of the input conductors, then almost all permissible combinations of input signals will be available on the output conductors.

Since it is desirable for electronic and other reasons that every output conductor connect to the same number of input conductors and every input conductor connect to the same number of output conductors, it will become apparent that obtaining such a balanced configuration in this more constrained form of random distribution is more complicated than simply providing a random distribution of the fraction of switching devices to each set of input conductors. We have devised a process for constructing such a switch matrix. As a first desirable feature although not necessary to the arrangement, the number of input and output conductors should both be divisible by the denominator of the fraction. If not, dummy input and output conductors may be added to the switch matrix during the assignment of switching device positions to make this true. These dummy conductors may be ignored after the assignment of positions is completed. Although this would destroy the balance of the switch matrix slightly, the balance would still be sufficient for all practical purposes.

Next, a first group of the input conductors equal in size to one over the denominator of the fraction of the total input conductors is selected. Each input conductor of this first group is provided a random distribution of switching devices by generating a random binary number for each input conductor, the random number having a number of "ones" equal to the fraction of the total number of output conductors. For example, for a switch matrix with one-half the number of switching devices, one-half the bits of the binary number for each conductor are ones. Then, for a matrix of one-half size, in the remaining half of the input conductors, each input conductor is assigned a binary number which is the complement of the binary number assigned to one of the input conductors of the first group of input conductors.

Finally, a switch is placed to connect an input conductor to an output conductor where each one appears in the binary number for that input conductor. For a switch matrix of one-half the number of switching devices, this is all that is necessary. This will cause each row of input conductors to have switching devices at one-half of the possible intersections and each column of the output conductors to similarly have switching devices at one-half of the possible intersections.

An example of such a distribution is illustrated in FIG. 4. In the figure, an eight by eight switching matrix is shown which includes rows R1–R8 of input conductors and columns C1–C8 of output conductors. Binary numbers are superimposed on these rows and columns. Each binary number includes eight bits (four ones and four zeroes), each bit positioned at an intersection of a logical column and row. If the bit is a one, a physical switching device is available for connecting the column and the row at that intersection. If the binary bit is a zero, no switch is available for that intersection. In FIG. 4, rows R1 and R5 form a matching pair so that the binary number for row R5 is the complement of the binary number for row R1. Similarly, rows R2 and R6, rows R3 and R7, and rows R4 and R8 form matching pairs with complementary binary numbers.

For other fractional numbers of switching devices, additional rules of arrangement apply. For a one-third switch matrix, binary numbers for the first third of the matrix input conductors are chosen in the same manner. As is shown in FIG. 5, the binary number chosen for each input conductor of the first group has one-third ones and two-thirds zeroes. For the second third of the matrix, a random number is selected for each input conductor in which the one-third of the ones may appear only where zeroes appear in the binary number of a selected (matching) one of the input conductors of the first third. Each input conductor of the second third is matched with an input conductor of the first third. The binary numbers for the last third are selected by providing ones in the columns where zeroes exist in both the matching row of the first third of input conductors and a matching row of the second third of input conductors. Again, a row of the first third, a row of the second third, and a row of the third third are matched to bring about this result. In the matrix illustrated in FIG. 5, rows R1, R4, and R7 are matching rows; rows R2, R5, and R8 are matching rows; and rows R3, R6, and R9 are matching rows.

Similarly for other fractional switch matrices, each of a first fraction of conductors (input or output) is assigned binary numbers randomly where each such binary number includes a number of ones equal to the fraction of the total number of intersections which might be made in a full switch matrix. The second fractional group of conductors are assigned binary numbers subrandomly where each such number includes a number of ones equal to the fraction of the total of intersections which might be made in a full switch matrix, but the ones are allowed only in the columns where fewer ones than the numerator of the fraction reside in a matching one of the conductors of the first fraction of conductors. The assignment of binary numbers for each additional fractional group of conductors continues in the same manner for each of the conductors for each additional fraction of conductors by placing ones only in the columns where fewer ones than the numerator of the fraction fall in matching conductors of all of the previously chosen fractional groups. Finally, the binary numbers for each of the last fraction of conductors are chosen by placing ones only in the columns where fewer ones than the numerator of the fraction exist in all of the matching conductors of each of the previously chosen fractional groups.

Finally, switching devices are furnished at each intersection where a one value occurs in the binary number assigned to each conductor to allow that conductor to connect to each intersecting conductor at such intersection. By this arrangement, there are an equal number of positions for each row which hold switching devices which may be closed as there are for every other row, there are an equal number of positions for each column which hold switching devices which may be closed as there are for every other column, the switching devices are randomly distributed, and the switch matrix will use only the fraction of the number of switching devices as is required by a full switch matrix yet will allow almost all permissible combinations of input conductors to be available on the output conductors.

To construct a matrix with two-fifths the number of possible switches as shown in FIG. 6, the input conductors are divided into five groups. For a first group of one fifth of the total of input conductors, random numbers are assigned to designate switching devices at two-fifths of the possible intersections for each input conductor of the group. Similarly, for a second group of one-fifth of the total of input conductors, random numbers are assigned to designate switching devices at two-fifths of the possible intersections for each input conductor of the group. For the third, fourth, and fifth groups of one-fifth of the input conductors, random numbers are assigned to designate switching devices at two-fifths of the possible intersections for each input conductor of each group but only at intersections with an output conductor which has not yet been connected to two matching input conductors of groups previously assigned switching devices.

A very generalized description of the method for assigning switches to the switch matrix is as follows. The method for arranging switching devices in a switch matrix having a plurality of input conductors and a plurality of output conductors arranged as logically intersecting rows and columns, and where the switch matrix has a total number of switches which are a preset fraction of possible intersections between rows and columns, has a general step of assigning individual random binary numbers of ones and zeroes to each conductor of either the plurality of input conductors or the plurality of output conductors. Each such binary number assigned to a conductor has a number of bits which represent all of the possible intersections of the conductor which might be made with all conductors which the conductor intersects. Moreover, the binary number assigned to each conductor includes binary ones substantially equal to the preset fraction of the total number of intersections which might be made with the conductor. The number need not be exact but should be close. The steps for carrying out the assignment start with assigning the conductors to which the random numbers are to be assigned into a number of groups, the number being equal to the denominator of the preset fraction. Then, the random binary numbers are assigned first to conductors of a first group of such conductors. Random binary numbers continue being assigned thereafter to conductors of additional groups of such conductors until all conductors of such groups have been assigned numbers.

However, after the first group has been assigned numbers, one and only one conductor of each additional group of conductors is matched to one conductor of each other group of conductors to which a binary number has been previously assigned. Additionally, each such binary number assigned to a conductor of each additional group includes ones representing intersections with an intersecting conductor only where fewer ones than the numerator of the preset fraction reside in the corresponding position in the binary numbers assigned to the matching ones of the conductors of all previous groups of conductors. For example, in the two-fifths matrix described, a one may be assigned in a position in a binary number in which only one previous binary one was assigned for all matching conductors connecting to the intersecting conducting which the one represents.

Finally, switching devices are furnished at each intersection where a one occurs in the binary number assigned to each conductor to allow that conductor to connect with each other conductor at such intersection.

It will be apparent to those skilled in the art that columns of output conductors might be randomized instead of rows of input conductors and the same type of distribution of switching devices reached.

We have found an especially advantageous combination to include one-half the total of switching devices used in a full connection switch matrix. Using this discovery, a switch matrix may be built which requires many fewer switching devices yet still allows the establishment of virtually all of the permissible combinations of connections in a shorter time than do prior art switch matrices. For example, we have found that a switch matrix having 336 input conductors and 24 output conductors constructed using the above-described arrangement provides coverage of virtually all possible combinations of 24 input signals even though only half the number of switching devices are used. For example, we found in testing ten million random combinations that all but seven such combinations could be found in such a matrix.

Constructing a fractional size switch matrix with a random distribution of the available switching devices ensures that a relatively large set of combinations of input conductors will be connectable to the output conductors, i.e., the coverage will be good. If the construction is not random, then the coverage may be very poor. For example, in a one-half size switch matrix, if all of the input conductors in the top half of the matrix have their switching devices in the same position and all of the input conductors in the bottom half of the matrix have their switching devices in the complementary positions, then the coverage will be minimal.

We have found a quick method to measure the mount of randomness in a particular switch matrix. If a switch matrix has N output conductors (columns), then there are $N(N-1)/2$ pairs of columns. We say that two of these columns intersect if both columns have switching devices on the same input conductor (row). The size of this intersection is the number of times this happens. The standard deviation of the sizes of all possible pairwise column intersections is a measure of the mount of randomness in a particular switch matrix. The lower this standard deviation, the better the coverage the switch matrix affords. In addition, having a low standard deviation forces the matrix to be almost balanced, that is, have the same number of switching devices on each row and column. Thus, a switch matrix may be generated with the purpose of keeping the standard deviation described as low as possible and tested to determine that this is true.

We have also discovered a rapid and accurate method for determining whether a particular permissible combination of input signals may in fact be connected to the output conductors even though the number of switching devices provided is limited to a fraction of those possible in a full connection switch matrix. This testing method selects those input conductors which it is desired to connect to the output conductors. Then, a sub-matrix of the switch matrix including these input conductors and all of the output conductors is considered apart from the remainder of the matrix. The number of ones in each column at connections with these input conductors are summed. The column having the least number of ones at these intersections is chosen. If more than one column has the same least number, any such column may be selected. Then the ones are summed in each of the selected input rows having a one at an intersection with the chosen column. The row having the least number of ones is selected. If more than one row has the same least number, any such row may be selected. The switch at the intersection of this first selected row and the first selected column is chosen for closure as a first step in providing the output combination desired.

Then a smaller sub-matrix of rows including all of the input rows except the selected row and all of the columns except the selected column is selected. The ones in those columns are summed individually by columns, and the column having the least number of ones is selected. The ones in rows of this sub-matrix having ones at the intersections with the second chosen column are each summed. Again, the row having the least number of ones is selected. A switch at the intersection of this second selected row and the second selected column is chosen for closure as a next step in providing the output combination desired.

This process continues until switching devices for connecting all of the rows and columns of the original group of input conductors are selected. If at any point in the selection process, no column has any ones remaining and there are still input conductors in the original combination which are not connected to an output conductor, then that connection cannot be made and the particular switch matrix fails for that combination. The process requires on the order of $N^2$ steps instead of the $N!$ steps required by prior art process where N is the number of output conductors. This allows the testing of a particular combination in a matter of a fraction of a second as opposed to hundreds of years with prior art processes. Thus, it becomes feasible to run millions of tests on a particular switch matrix to determine one which has the best possible coverage.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for assigning the placement of switching devices in a switch matrix having a plurality of input conductors and a plurality of output conductors arranged as logically intersecting rows and columns, the switch matrix having a number of switches which is a preset fraction of possible intersections between rows and columns, comprising the steps of:

assigning individual random binary numbers of ones and zeroes to each conductor of a selected plurality of either the plurality of input conductors or the plurality of output conductors, each such binary number assigned to a conductor of the selected plurality having a number of bits representing intersections of the conductor which might be made with all conductors which the conductor intersects and which binary number includes ones substantially equal to the preset fraction of the total number of intersections which might be made with the conductor, the random binary numbers being assigned first to conductors of a first group of such conductors of a first number equal to the denominator of the preset fraction of such conductors, the random binary numbers being assigned thereafter to conductors of additional groups of the first number of such conductors until the preset fraction of the selected plurality have been assigned numbers, where one and only one conductor of each group of conductors is matched to one conductor of each other group of conductors to which a binary number has been previously assigned, where each such binary number assigned to a conductor of each additional group includes ones representing intersections with an intersecting conductor only where one less than the numerator of the preset fraction of binary ones resides in binary numbers assigned to matching ones of the conductors of all previous groups of conductors, and providing switching devices at each intersection where a one occurs in the binary number assigned to that conductor to allow that conductor to connect with each other conductor at such intersection.

* * * * *

UNITED STATES PATENT AND TRADEMARK OFFICE
CERTIFICATE OF CORRECTION

PATENT NO. : 5,436,576
DATED : July 25, 1995
INVENTOR(S) : Hibdon et al.

It is certified that error appears in the above-indentified patent and that said Letters Patent is hereby corrected as shown below:

In column 9, at line 24 and again at line 32, delete "mount" and substitute --amount--.

Signed and Sealed this

Thirty-first Day of December, 1996

Attest:

BRUCE LEHMAN

Attesting Officer

Commissioner of Patents and Trademarks